United States Patent [19]
Chen et al.

[11] Patent Number: 5,995,417
[45] Date of Patent: Nov. 30, 1999

[54] SCHEME FOR PAGE ERASE AND ERASE VERIFY IN A NON-VOLATILE MEMORY ARRAY

[75] Inventors: Pau-Ling Chen, Saratoga; Michael S. C. Chung; Shane C. Hollmer, both of San Jose; Vincent Leung; Binh Quang Le, both of Mountain View; Masaru Yano, Sunnyvale, all of Calif.

[73] Assignee: Advanced Micro Devices, Inc., Sunnyvale, Calif.

[21] Appl. No.: 09/175,646

[22] Filed: Oct. 20, 1998

[51] Int. Cl.[6] ............................. G11C 16/04; G11C 16/06
[52] U.S. Cl. .............................. 365/185.29; 365/185.12; 365/185.18; 365/185.22; 365/218
[58] Field of Search ......................... 365/185.12, 185.13, 365/185.17, 185.18, 185.22, 185.23, 185.27, 185.29, 185.33, 218

[56] References Cited

U.S. PATENT DOCUMENTS

| | | | |
|---|---|---|---|
| 4,805,151 | 2/1989 | Terada et al. | 365/185.12 |
| 5,109,361 | 4/1992 | Yim et al. | 365/185.12 |
| 5,126,808 | 6/1992 | Montalvo et al. | 365/185.12 |
| 5,185,718 | 2/1993 | Rinerson et al. | 365/185.12 |
| 5,270,980 | 12/1993 | Pathak et al. | 365/185.12 |
| 5,283,758 | 2/1994 | Nakayama et al. | 365/185.12 |
| 5,365,484 | 11/1994 | Cleveland et al. | 365/185.12 |
| 5,384,742 | 1/1995 | Miyakawa et al. | 365/185.12 |
| 5,671,178 | 9/1997 | Park et al. | 365/185.12 |
| 5,696,717 | 12/1997 | Koh | 365/185.12 |
| 5,801,994 | 9/1998 | Chang et al. | 365/185.12 |
| 5,835,414 | 11/1998 | Hung et al. | 365/185.12 |

*Primary Examiner*—Trong Phan
*Attorney, Agent, or Firm*—Fliesler. Dubb, Meyer & Lovejoy

[57] ABSTRACT

A non-volatile memory device includes a plurality of MOS transistors 34 and 36 connected to respective word lines 16 and 18 to allow individual pages of memory stored in the memory cells 8a, 10a and 8b, 10b on the respective word lines 16 and 18 to be erased and erase verified. A method of erasing a page of memory cells includes the steps of applying an erase voltage to one of the MOS transistors 16 and 18 to erase the page of memory cells along the respective word line, and applying an initial erase-inhibit floating voltage to other MOS transistors which are connected to the word lines unselected for page erase. In an erase verify mode, an erase verify voltage is applied to the word line which was selected for page erase in the erase mode, and an erase verify unselect voltage is applied to the word lines which was not selected for page erase.

56 Claims, 2 Drawing Sheets

SCHEME FOR PAGE ERASE AND ERASE VERIFY IN A NON-VOLATILE MEMORY ARRAY

TECHNICAL FIELD

The present invention relates to a non-volatile memory device, and to a method of erasing and erase verifying a page of memory in the non-volatile memory device.

BACKGROUND ART

Non-volatile memory devices have been developed by the semiconductor integrated circuit industry for various applications such as computers and digital communications. Examples of non-volatile memory devices include conventional electronically erasable programmable read-only memories (EEPROMs) and flash memories. A conventional EEPROM typically includes a plurality of dual-gate NAND memory gates arranged in an array on a semiconductor chip.

In a conventional NAND non-volatile memory array, the NAND memory gates are arranged in a plurality of rows and columns, with each row of the NAND gates connected to a respective word line and each column of the NAND gates connected to a respective bit line. Each NAND gate typically has a dual-gate structure which includes a floating gate, a control gate, and an interpolysilicon dielectric layer between the floating gate and the control gate. When the NAND flash memory circuit is implemented on a silicon-based semiconductor chip, the floating gates are formed by a patterned first polysilicon (POLY-1) layer, and the control gates are formed by a patterned second polysilicon (POLY-2) layer on top of the interpolysilicon layer and the POLY-1 layer. The bit lines are implemented on the semiconductor chip as metal layer strips which are connected across the respective columns of the NAND memory gates, whereas the word lines are implemented as POLY-2 layer strips which are connected across the control gates of the respective rows of the NAND memory gates.

In a conventional NAND flash memory array, the NAND gates on each word line are capable of storing a binary word consisting of a plurality of bits. The conventional NAND flash memory device has five modes of operation, including a program mode, a program verify mode, a read mode, an erase mode, and an erase verify mode. A page is defined as one word of memory storage on a single word line. A sector is defined as a plurality of pages, for example, sixteen pages of memory storage. During the operation of a conventional NAND flash memory array in the erase mode, a whole sector of memory cells is erased at a time. When the conventional NAND flash memory array is in the erase verify mode after the erase operation, the whole sector of memory cells is erase verified at a time.

A disadvantage of having to erase a whole sector of multiple pages of memory cells at a time is that an application may require the erasure of some of the words while retaining others in the same sector of memory cells. Because of the inconvenience of having to erase a whole sector of memory cells at a time, if some of the words in a sector are desired to be retained, the conventional NAND flash memory device would require rewriting the words which are to be retained after the erasure of the whole sector of memory cells. Therefore, there is a need for a NAND flash memory device and a method of erasing portions of a sector of memory cells without having to erase the whole sector.

SUMMARY OF THE INVENTION

The present invention satisfies this need. The present invention provides a method of erasing a page of memory in a non-volatile memory device comprising a plurality of memory cells arranged in a plurality of word lines connected to respective rows of the memory cells, the word lines coupled to a plurality of respective metal oxide semiconductor (MOS) transistors each comprising a gate, a source and a drain. In accordance with the present invention, the method of page erase generally comprises the steps of:

(a) applying an erase voltage to a selected one of the word lines to erase a selected page of memory on the selected word line; and (b) applying an initial erase-inhibit floating voltage to an unselected one of the word lines to maintain a page of memory unselected for page erase on the unselected word line.

In an embodiment, the erase voltage applied to the selected MOS transistor connected to the selected word line is on the order of about 0 V, and the initial erase-inhibit floating voltage applied to the unselected word line is $V_{cc}-V_{tn}$, which is typically in the range of about 1.7 V to about 2.3 V. The unselected word lines are essentially floating at this time. When a substrate voltage on the order of about 20 V is applied to the substrate in the erase mode, the unselected word lines are then coupled up to the substrate voltage. Furthermore, in an embodiment in which the MOS transistors comprise n-channel MOS (NMOS) transistors, the sources of the NMOS transistors are connected to the respective word lines, and the erase voltage is applied to the drain of the selected NMOS transistor in the erase mode to erase the memory on the selected word line.

In a further embodiment, a substrate voltage on the order of about 20 V is applied to the p-well of the substrate, and a gate turn-on voltage in the range of about 2.7 V to about 3.3 V is applied to the gates of the NMOS transistors in the erase mode. The non-selected word lines, which are initially floating, are subsequently coupled up to a voltage of about 20 V when the substrate voltage of about 20 V is applied to the p-well of the substrate.

In yet a further embodiment in a page erase verify mode, the method according to the present invention further comprises the steps of:

(c) applying an erase verify voltage to the selected word line subsequent to the step of applying the erase voltage to the selected word line to verify that the selected page of memory was erased; and (d) applying an erase verify unselect voltage to the unselected word line subsequent to the step of applying the initial erase-inhibit floating voltage to the unselected word line to avoid erase verifying the unselected page of memory which was erase-inhibited.

In an embodiment, the erase verify voltage applied to the selected MOS transistor to which the selected word line is connected is about 0 V, and the erase verify unselect voltage applied to the unselected MOS transistors connected to the unselected word lines is on the order of about 4.5 V. In an embodiment in which the MOS transistors comprise NMOS transistors, the erase verify voltage and the erase verify unselect voltage are applied to the drains of the NMOS transistors.

In a further embodiment, an array ground voltage on the order of about 0.7 V is applied to the array ground of the flash memory array in the erase verify mode. In yet a further embodiment, a gate turn-on voltage in the range of about 7 V to about 8 V is applied to the gates of the NMOS transistors in order to drive the unselected word lines to about 4.5 V. The p-well of the substrate is grounded at 0 V in the erase verify mode.

The present invention also provides a non-volatile memory device which generally comprises:

(a) a semiconductor substrate capable of being applied a first substrate voltage to set the memory device in an erase mode;

(b) an array of memory cells arranged in a plurality of rows on the substrate, each of the memory cells capable of storing a respective bit;

(c) a plurality of word lines each connected to a respective one of the rows of the memory cells; and (d) a plurality of MOS transistors each connected to a respective one of the word lines, each of the word lines capable of receiving an erase voltage to erase the bits stored in the memory cells on the respective word line, and further capable of receiving an initial erase-inhibit floating voltage to maintain the bits stored in the memory cells on the respective word line in the erase mode.

In an embodiment, the non-volatile memory device according to the present invention further comprises a word line pump connected to provide a gate turn-on voltage to the gates of the MOS transistors. In a further embodiment, the non-volatile memory device further comprises an X-decoder connected to the word line pump to generate the gate turn-on voltage. An X-decoder and a word line pump are provided for the MOS transistors within each sector of memory cells.

In a further embodiment, the non-volatile memory device according to the present invention further comprises an XT-decoder connected to provide the erase voltage to the respective MOS transistors in the erase mode, and to provide erase verify and erase verify unselect voltages to the respective MOS transistors in the erase verify mode.

In the erase mode, a substrate voltage on the order of about 20 V is applied to the p-well of the substrate of the non-volatile memory device, whereas in the erase verify mode, the p-well of the substrate is grounded at 0 V.

In a further embodiment, each sector of the memory array comprises a plurality of select drain devices and a plurality of select source devices. The gates of the select drain devices and the gates of the select source devices are initially floating and subsequently coupled up to the substrate voltage of about 20 V in the erase mode. In the erase verify mode, the gates of the select drain devices and the select source devices are driven to a voltage of about 4.5 V, while the array ground is applied a voltage of about 0.7 V.

Advantageously, the non-volatile memory device and the method of erasing and erase-verifying a page of memory cells in the non-volatile memory device according to the present invention allow the user to erase any page of memory cells on any one of the word lines individually, thereby obviating the need for erasing a whole sector of multiple pages of memory cells in applications in which not all pages in the sector need be erased.

BRIEF DESCRIPTION OF THE DRAWINGS

The present invention will be described with respect to particular embodiments thereof, and references will be made to the drawings in which.

DETAILED DESCRIPTION OF THE PREFERRED EMBODIMENTS

Figure 1:
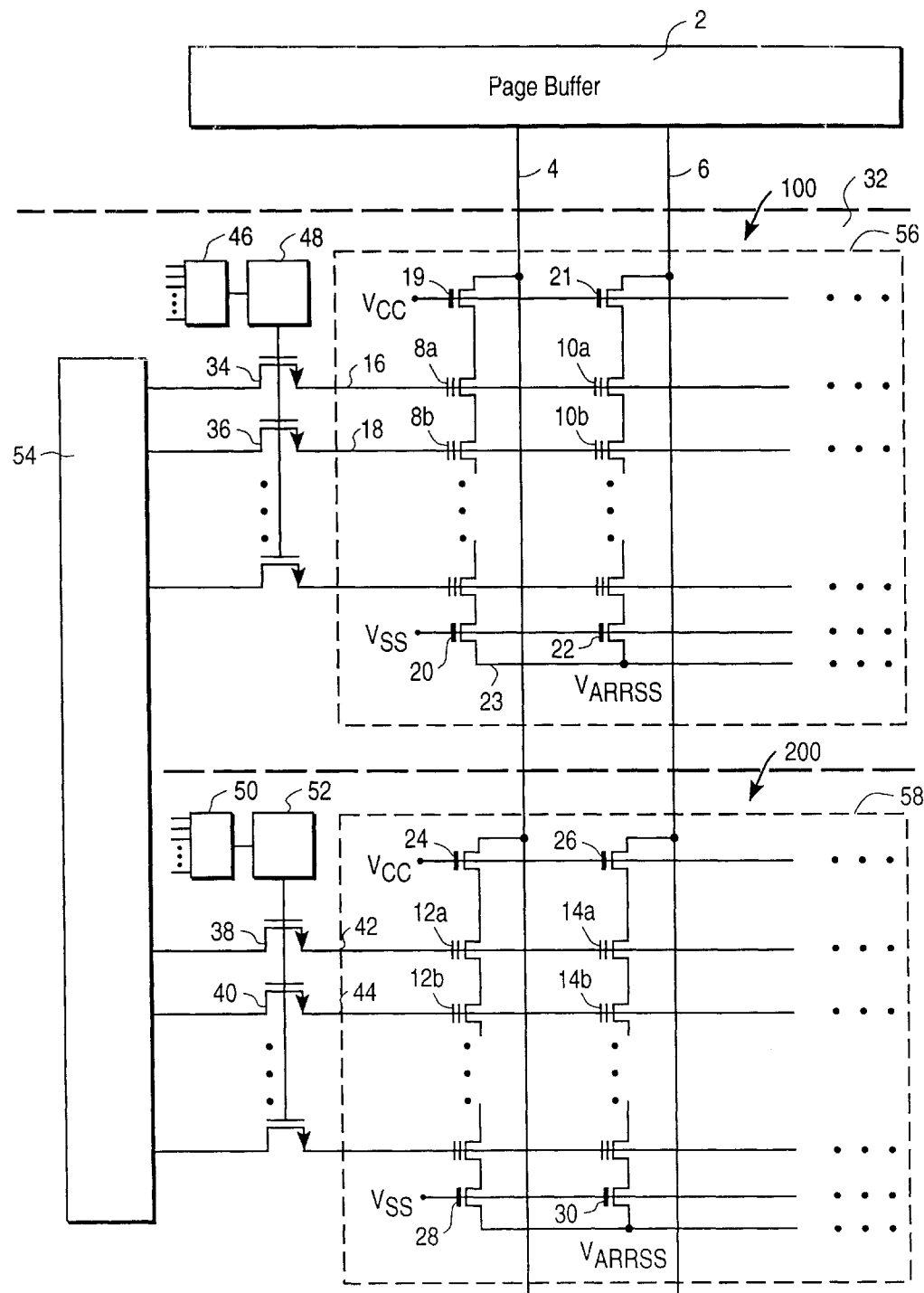
FIG. 1 is a circuit diagram of a non-volatile memory device in accordance with the present invention showing a plurality of sectors each comprising a plurality of pages of-memory cells.

FIG. 1 shows a circuit diagram of a non-volatile memory device which allows individual pages of memory cells to be erased and erase verified in accordance with the present invention. The non-volatile memory device according to the present invention includes a plurality of sectors of memory cells, such as sectors 100 and 200 as shown in FIG. 1, a page buffer 2, and a plurality of bit lines 4 and 6 each connected to a respective column of memory cells. Within the first sector 100, the memory cells are shown as a plurality of NAND gates 8a, 8b, . . . and 10a, 10b, . . . along the bit lines 4 and 6, respectively. Within the second sector 200, the memory cells are shown as NAND gates 12a, 12b, . . . and 14a, 14b, . . . along the bit lines 4 and 6, respectively.

In sector 100, a plurality of word lines such as word lines 16 and 18 are connected across the respective rows of NAND memory cells 8a, 10a, . . . and 8b, 10b, . . . , respectively. The NAND memory cells on each of the word lines store one page of memory. Each sector of memory comprises a plurality of pages, for example, sixteen pages of memory cells disposed along sixteen word lines in a typical NAND array. Each of the memory cells 8a, 8b, 10a, 10b, . . . is capable of storing a respective bit.

Within each of the sectors, each column of memory cells is connected to the gate of a select drain device and the gate of a select source device, which are supplied with a voltage $V_{cc}$ and a voltage $V_{ss}$, respectively. For example, in the first sector 100, the gates of the select drain devices 19 and 21 are connected to the respective columns of core memory cells 8a, 8b, . . . and 10a, 10b, . . . along the bit lines 4 and 6, respectively. Furthermore, select source gates 20 and 22 are connected to the respective columns of the memory cells 8a, 8b, . . . and 10a, 10b, . . . within the first sector 100. Similarly, in the second sector 200, the gates of the select drain devices 24 and 26 are connected to the respective columns of core memory cells 12a, 12b, . . . and 14a, 14b, . . . along the respective bit lines 4 and 6. Furthermore, select source gates 28 and 30 are connected to the respective columns of the memory cells 12a, 12b, . . . and 14a, 14b, . . . in the second sector 200.

When the flash memory device is in the erase mode, the gates of both the select drain devices 19 and 21 and the select source devices 20 and 22 are not driven to particular DC voltages. The gates of the select drain and select source devices are initially floating at a voltage of $V_{cc\text{-}Vtn}$ when the flash memory is set to the erase mode, and are subsequently coupled up to a substrate voltage, which is the voltage applied to the substrate of the flash memory device during erase operation and is typically on the order of about 20 V. When the flash memory device is set to the erase verify mode, the substrate 32 is grounded at 0 V and the gates of both the select drain devices 19 and 21 and the select source devices 20 and 22 are driven to a voltage on the order of about 4.5 V. The erase and erase verify operations of the flash memory device in accordance with the present invention will be described in further details below.

The memory cells, the select drain gates and the select source gates in both sectors 100 and 200 are disposed on a single semiconductor substrate 32. The core memory cells 8a, 8b, 10a, 10b, 12a, 12b, 14a, 14b, . . . are sited on the p-wells 56 and 58 of the substrate 32. The p-well 56 for the memory sector 100 is a portion of the substrate 32 directly underneath the core memory cells 8a, 8b, 10a, 10b, . . . , and is well known to a person skilled in the art. Similarly, the p-well 58 for the memory sector 200 is a portion of the substrate directly underneath the core memory cells 12a, 12b, 14a, 14b, . . . An example of a conventional p-well is described in Momodomi et al., U.S. Pat. No. Re. 35,838, incorporated herein by reference. The substrate, the p-well, the NAND memory cells, the select drain gates and the select source gates may be fabricated by using conventional methods which are known to a person skilled in the art.

The non-volatile memory device according to the present invention is capable of memory operations in a program mode, a program verify mode, a read mode, an erase mode and an erase verify mode. Because the present invention concerns only the erase and erase verify modes, only the erase and erase verify operations will be described in detail. In the program, program verify, and read modes, the non-volatile memory device according to the present invention may be operated using conventional methods known to a person skilled in the art.

In accordance with the present invention, a plurality of metal oxide semiconductor (MOS) transistors, such as n-channel MOS (NMOS) transistors, are each connected to a respective one of the word lines in each of the sectors. For example, in the first sector 100, NMOS transistors 34 and 36 are connected to word lines 16 and 18, respectively. In the second sector 200, NMOS transistors 38 and 40 are connected to word lines 42 and 44, which are connected across the respective columns of the memory cells 12a, 14a, . . . and 12b, 14b, . . . , respectively. In the erase mode, each of the MOS transistors is capable of receiving an erase voltage to erase the bits stored in the memory cells on the respective word line, and is also capable of receiving an initial erase-inhibit floating voltage to maintain the bits stored in the memory cells on the respective word line.

When the non-volatile memory device is in the erase mode according to the present invention, the substrate voltage on the order of about 20 V is applied to the p-well 56 of the substrate 32. In an embodiment, the erase voltage applied to the word line selected to be erased is on the order of about 0 V, whereas the erase-inhibit voltage initially floating on the word lines which are not selected for page erase is a voltage $V_{cc}-V_{tn}$, where $V_{cc}$ is a voltage typically in the range of about 2.7 V to 3.3 V, and $V_{tn}$ is the threshold voltage of the MOS transistor. The erase voltage may simply be the ground voltage of 0 V.

The initial erase-inhibit floating voltage is the voltage on the unselected word lines in the erase mode before the unselected word lines are coupled up to the substrate voltage. Since the voltage $V_{cc}$ is typically in the range of about 2.7 V to about 3.3 V and the threshold voltage $V_{tn}$ is typically on the order of about 1 V, the initial erase-inhibit floating voltage is typically in the range of about 1.7 V to 2.3 V on the unselected word lines for an erase-inhibit action. After the substrate voltage $V_{sub}$, which is typically on the order of about 20 V, is applied to the substrate 32 of the flash memory device in the erase mode, the unselected word lines are subsequently coupled up to the substrate voltage $V_{sub}$ to be erased-inhibited.

The ranges of erase and erase-inhibit voltages described above are only examples of a page erase operation in a given sector of the non-volatile memory device according to the present invention. However, the principles of the present invention are not limited to these voltage ranges. Other erase and erase-inhibit voltages may be applied to the word lines in a different embodiment.

In a further embodiment, a word line pump is connected to the gates of the MOS transistors within each of the sectors, and an X-decoder is connected to each word line pump to control the voltage at the gates of the MOS transistors within each sector. For example, within the first sector 100, a first X-decoder 46 is connected to a first word line pump 48, which is connected to provide the gate turn-on voltage to the gates of the MOS transistors 34 and 36 in the erase mode. Similarly for the second sector 200 of memory cells, a second X-decoder 50 is connected to a second word line pump 52, which is connected to the gates of the MOS transistors 38 and 40.

In yet a further embodiment, the MOS transistors within each of the sectors are connected to a row decoder, also called an XT-decoder which provides the driving voltages to the respective MOS transistors in the erase mode. In an embodiment in which the MOS transistors comprise n-channel MOS (NMOS) transistors, the row decoder 54 is connected to the drains of the MOS transistors to provide the erase and initial erase-inhibit floating voltages. For example, as shown in FIG. 1, a row decoder 54 is connected to the drains of the NMOS transistors 34 and 36 in the first sector 100 and to the drains of the NMOS transistors 38 and 40 in the second sector 200.

Figure 1A:
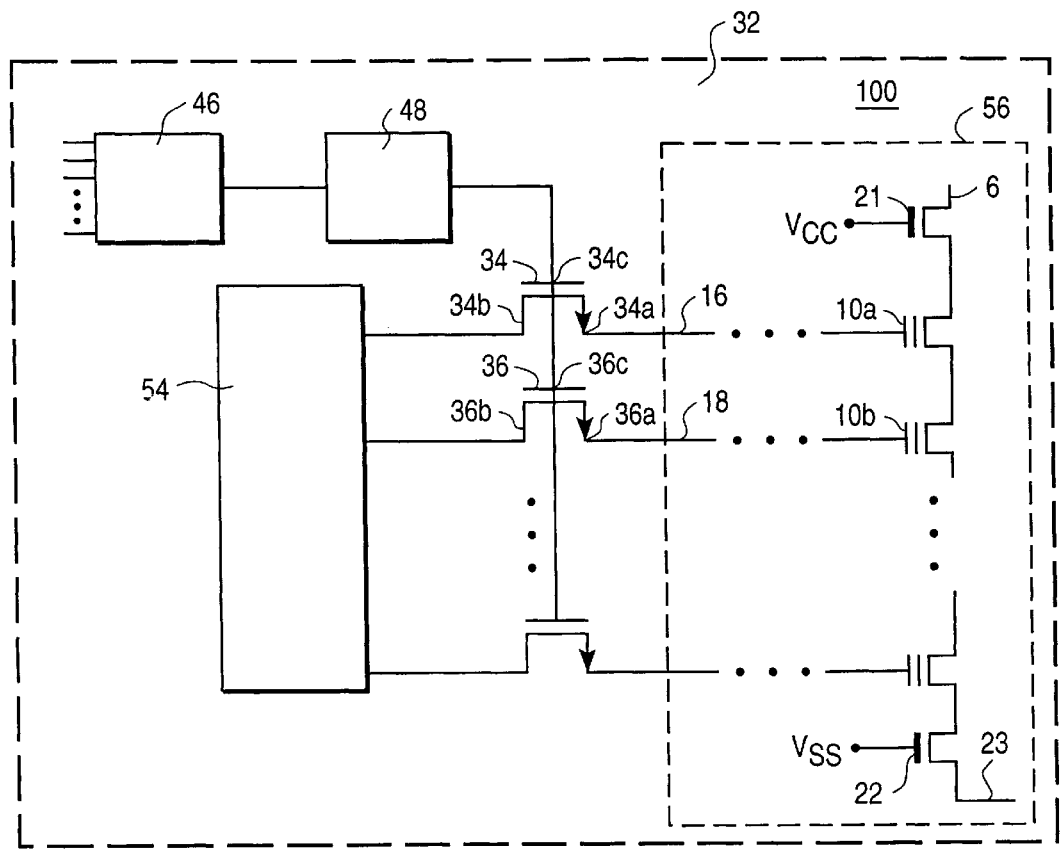
FIG. 1A is a circuit diagram showing the MOS transistors, decoders and word line pump for one of the sectors of memory cells as shown in FIG. 1 according to the present invention.

FIG. 1A shows the decoders, the word line pump and the MOS transistors for a page erase operation in the first sector 100 of memory cells according to the present invention. For the purpose of illustration, only one column of core memory cells 10a, 10b, . . . , which are connected to the select drain gate 21 and the select source gate 22 along the bit line 6, is shown. The principles of the page erase and erase verify operations also apply to other memory cells along other bit lines within the memory sector 100. The MOS transistors 34 and 36 are shown as NMOS transistors with respective sources 34a and 36a connected to the word lines 16 and 18, respectively. The drains 34b and 36b of the NMOS transistors 34 and 36 are connected to the XT-decoder 54, which generates the erase and initial erase-inhibit floating voltages for the drains of the respective NMOS transistors. The word line pump 48 is connected to the gates 34c and 36c of the NMOS transistors 34 and 36, respectively, to provide a gate turn-on voltage in response to a turn-on command by the X-decoder 46 in the erase mode.

Figure 2:
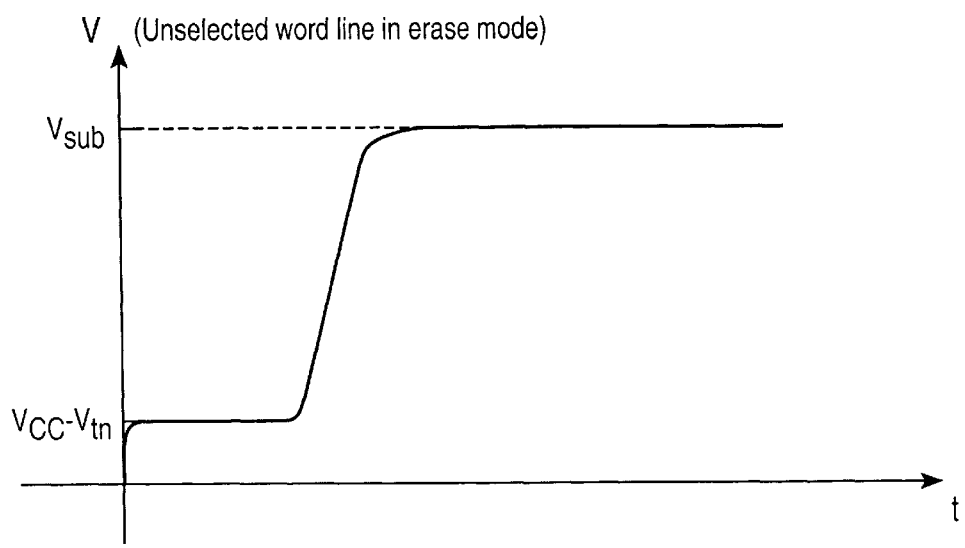
FIG. 2 shows a curve of voltages on an unselected word line as it is coupled up from a floating voltage $V_{cc\text{-}Vtn}$ to a substrate voltage of about 20 V in the erase mode.

The XT-decoder 54, which is connected to the drains 34b and 36b of the NMOS transistors 34 and 36, provides either an erase voltage or an initial erase-inhibit floating voltage to each of the NMOS transistors. In this manner, the memory cells in sector 100 can be selectively erased one page at a time. For example, if the page of memory cells on the word line 18 need be erased, then the XT-decoder 54 supplies an erase voltage on the order of about 0 V to the drain 36b of the NsOS transistor 36. In the meantime, the XT-decoder 54 supplies an initial erase-inhibit floating voltage VVt in the range of about 1.7 V to about 2.3 V to the drains of other NMOS transistors to cause the unselected word lines which are to be erase-inhibited to float initially. When the substrate voltage $V_{sub}$ on the order of about 20 V is applied to the substrate 32 in the erase mode, the unselected word lines are then coupled up to the substrate voltage of about 20 V. the coupling up of the unselected word lines in the erase mode from the floating voltage $V_{cc}-V_{tn}$ to the substrate voltage $V_{sub}$ is illustrated by the voltage curve shown in FIG. 2. The unselected word lines on which the pages of memory cells are not to be erased are allowed to float at $V_{cc}-V_{tn}$ initially. For example, the initial erase-inhibit floating voltage can be applied to the drain 34b of the NMOS transistor 34 as shown in FIG. 1A to maintain the bits stored in the unselected page of memory cells including the memory cell 10a along the unselected word line 16 when the memory device is in the erase mode.

In the erase mode, a voltage $V_{cc}$ in the range of about 2.7 V to about 3.3 V is supplied by the word line pump 48 to the gates of the MOS transistors such that the MOS transistors 34 and 36 are turned on. When the initial erase-inhibit floating voltage $V_{cc}$-$V_{tn}$, which is in the range of about 1.7 V to 2.3 V, is applied to the drain 36b of the NMOS transistor 36, for example, the gate 36c of the NMOS transistor 36 is turned on, thereby driving the unselected word line 18 initially to the floating voltage $V_{cc}$-$V_{tn}$. When the substrate voltage $V_{sub}$ on the order of about 20 V is applied to the substrate 32, the voltage on the unselected word line 18 is then coupled up to a higher voltage close to the substrate voltage of about 20 V. The unselect word line 18 is thus erase-inhibited in response to the application of the voltage $V_{sub}$ of about 20 V to the substrate 32 in the erase mode.

On the other hand, when the drain 34b of the NMOS transistor 34 is grounded at 0 V, for example, the source 34a of the NMOS transistor 34 is also grounded, thereby grounding the word line 16 to erase the page of memory cells along the word line 16. The gates of the select drain device 21 and the select source device 22 are initially floating at the voltage $V_{cc}$-$V_{tn}$ and subsequently coupled up to about 20 V when the substrate voltage of about 20 V is applied to the p-well of the substrate 32 in the erase mode. The array ground 23 is also initially floating at $V_{cc}$-$V_{tn}$ and then coupled up to about 20 V in the erase mode.

The non-volatile memory device according to the present invention is also capable of operating in an erase verify mode subsequent to the page erase operation of the memory device in the erase mode. In the erase verify mode, the p-well of the substrate 32 is grounded at 0 V. In order to verify that a selected page of memory cells on a selected word line has been erased, an erase verify voltage is applied to the MOS transistor to which the selected word line is connected such that the memory cells along the word line are "read", thereby verifying that the page of memory cells on the word line has been erased. For example, after the memory cells along the word line 18 have been erased in the erase mode, the memory device is then set to operate in the erase verify mode by grounding the p-well of the substrate 32. When the device is in the erase verify mode, an erase verify voltage of about 0 V is supplied by the XT-decoder 54 to the drain 36b of the NMOS transistor 36 to drive the word line 18 to about 0 V. In the erase verify mode, the gates of both the select drain device 21 and the select source device 22 are applied a voltage of about 4.5 V, while the array ground is driven to an array ground voltage $V_{ARSS}$ of about 0.7 V. The array ground 23 as shown in FIG. 1 is a conductive line segment connected to the sources of the select source devices 20 and 22 in the first memory sector 100.

For unselected pages of memory cells which have been erase-inhibited in the erase mode, an erase verify unselect voltage is supplied by the XT-decoder 54 to the drains of the NMOS transistors to which the erase-inhibited word lines are connected. For example, the erase verify unselect voltage can be applied to the drain 34b of the NMOS transistor 34, the source 34a of which is connected to the unselected word line 16, which was unselected for page erase in the previous example. By applying the erase verify unselect voltage to the drain 34b of the NMOS transistor 34, the memory cells along the word line 16 are unselected for a "read" operation since the erase-inhibited word line 16 has maintained the bits stored in the respective memory cells in the erase mode. In an embodiment, the erase verify unselect voltage is on the order of about 4.5 V.

In the erase verify mode, a gate turn-on voltage sufficient to pass a voltage of about 4.5 V from the drain to the source, for example, a voltage in the range of about 7 V to 8 V, is supplied by the X-decoder 48 to the gates 34c and 36c of the MOS transistors 34 and 36 within sector 100 to turn the MOS transistors on. A select drain gate voltage on the order of about 4.5 V is applied to the gate of the select drain device 21, and the same voltage is applied to the gate of the select source device 22 in the erase verify mode. The array ground 23 is driven to an array ground voltage $V_{ARRSS}$ of about 0.7 V. When the pages of memory cells are erase verified in the erase verify mode according to the present invention, only the word line which was selected for page erase in the erase mode is erase verified in the erase verify mode. The word lines which were not selected for page erase in the erase mode are not selected for erase verify in the erase verify mode. The page erase and page erase verify operations of the memory cells in sector 100 are also applicable to other sectors in the memory device, such as sector 200 as shown in FIG. 1.

The voltages on the selected word line, on the unselected word lines, on the NMOS gates, on the gates of select source and select drain devices, on the array ground, and on the substrate when the flash memory device is operating in the erase and erase verify modes according to the present invention are listed in the table below:

TABLE

| | Mode | |
|---|---|---|
| | Erase | Erase Verify |
| Selected Word Line | ~0 V | ~0 V |
| Unselected Word Line | Float at $V_{cc}$–$V_{tn}$; then coupled up to ~20 V | ~4.5 V |
| NMOS Gate | $V_{cc}$: 2.7~3.3 V | 7~8 V |
| Gates of Select Drain Devices | same as unselected word line | ~4.5 V |
| Gates of Select Source Devices | same as unselected word line | ~4.5 V |
| Array Ground | same as unselected word line | ~0.7 V |
| Substrate | ~20 V | ~0 V |

INDUSTRIAL APPLICABILITY

The present invention is applicable to non-volatile memory devices, and more particularly to NAND flash memory devices. The circuit and method according to the present invention allow a NAND flash memory array to be erased and erase verified one page at a time, thereby providing flexibility to a user or programmer when selective erasure of any individual page of memory cells on a respective word line in any sector of the NAND array is desired. Therefore, the present invention obviates the need to erase a whole sector of multiple pages of memory cells in a NAND array and the need to subsequently rewrite some of the pages in the sector when not all pages of memory cells in the sector are desired to be erased.

The invention has been described with respective particular embodiments thereof, and numerous modifications can be made which are within the scope of the invention as set forth in the claims.

What is claimed is:

1. A non-volatile memory device, comprising:
   (a) a semiconductor substrate capable of being applied of first substrate voltage to set the memory device in an erase mode;

(b) an array of memory cells arranged in a plurality of rows on the substrate, each of the memory cells capable of storing a respective bit;

(c) a plurality of word lines each connected to a respective one of the rows of the memory cells;

(d) a plurality of metal oxide semiconductor (MOS) transistors each connected to a respective one of the word lines, wherein the MOS transistors comprise respective gates, each of the word lines in the erase mode capable of receiving an erase voltage to erase the bits stored in the memory cells on the word line if it is selected for page erase and an initial erase-inhibit floating voltage to maintain the bits stored in the memory cells on the word line if it is unselected for page erase; and (e) a word line pump connected to provide a first gate turn-on voltage to the gates of the MOS transistors.

2. The non-volatile memory device of claim 1, further comprising an X-decoder connected to the word line pump.

3. The non-volatile memory device of claim 1, wherein the substrate is further capable of being applied a second substrate voltage to set the memory device in an erase-verify mode, and wherein each of the MOS transistors in the erase verify mode is capable of receiving an erase verify voltage to verify whether the memory cells on the word line have been erased if it was selected for page erase in the erase mode and erase verify unselect voltage to unselect the word line for erase verify if it was unselected for page erase in the erase mode.

4. The non-volatile memory device of claim 3, wherein the erase verify voltage is on the order of about 0 V.

5. The non-volatile memory device of claim 3, wherein the erase verify unselect voltage is on the order of about 4.5 V.

6. The non-volatile memory device of claim 3, wherein the MOS transistors comprise respective gates, further comprising a word line pump connected to provide a second gate turn-on voltage to the gates of the MOS transistor.

7. The non-volatile memory device of claim 6, wherein the second gate turn-on voltage is in the range of about 7 V to about 8 V in the erase verify mode.

8. A non-volatile memory device, comprising:

(a) a semiconductor substrate capable of being applied a first substrate voltage to set the memory device in an erase mode;

(b) an array of memory cells arranged in a plurality of rows on the substrate, each of the memory cells capable of storing a respective bit;

(c) a plurality of word lines each connected to a respective one of the rows of the memory cells;

(d) a plurality of metal oxide semiconductor (MOS) transistors each connected to a respective one of the word lines, each of the word lines in the erase mode capable of receiving an erase voltage to erase the bits stored in the memory cells on the word line if it is selected for page erase and an initial erase-inhibit floating voltage to maintain the bits stored in the memory cells on the word line if it is unselected for page erase; and (e) a plurality of select source and select drain devices comprising a plurality of gates connected to the array of memory cells, the gates of the select drain devices and select source devices capable of receiving a voltage on the order of about 4.5 V in the erase verify mode.

9. A method of erasing a page of memory in a non-volatile memory device comprising a plurality of memory cells arranged in a plurality of sectors, each of the sectors comprising a plurality of word lines each connected to a respective one of a plurality of rows of the memory cells, the method comprising the steps of:

(a) apply an erase voltage to a selected one of the word lines to erase a selected page of memory on the selected word line;

(b) apply an initial erase-inhibit floating voltage to an unselected one of the word lines to maintain a page of memory unselected for page erase on the unselected word line;

(c) applying an erase verify voltage to the selected word line subsequent to the step of applying the erase voltage to the selected word line to verify that the selected page of memory was erased; and (d) applying an erase verify unselect voltage to the unselected word line subsequent to the step of applying the initial erase-inhibit floating voltage to the unselected word line to avoid erase verifying the unselected page of memory which was erase-inhibited.

10. The method of claim 9, wherein the erase verify voltage applied to the selected word line is on the order of about 0 V.

11. The method of claim 9, wherein the erase verify unselect voltage applied to the unselected word line is on the order of about 4.5 V.

12. The method of claim 9, wherein the non-volatile memory device further comprises a plurality of n-channel MOS (NMOS) transistors including a first NMOS transistor connected to the selected word line and a second NMOS transistor connected to the unselected word line, each of the NMOS transistors comprising a source, a drain and a gate, wherein the step of applying the erase verify voltage comprises the step of applying the erase verify voltage to the drain of the first NMOS transistor, and wherein the step of applying the erase verify unselect voltage comprises the step of applying the erase verify unselect voltage to the drain of the second NMOS transistor.

13. A method of erasing and erase-verifying a page of memory in a non-volatile memory device comprising a plurality of memory cells arranged in a plurality of sectors, each of the sectors comprising a plurality of word lines each connected to a respective one of a plurality of rows of the memory cells, each of the word lines coupled to a respective one of a plurality of metal oxide semiconductor (MOS) transistors each comprising a gate, a source and a drain, the method comprising the steps of:

(a) applying an erase voltage to a selected one of the MOS transistors to erase a selected page of memory on a selected one of the word lines to which the selected MOS transistor is connected;

(b) applying an initial erase-inhibit floating voltage to an unselected one of the MOS transistors to maintain an unselected page of memory on an unselected one of the word lines to which the unselected MOS transistor is connected;

(c) applying an erase verify voltage to the selected MOS transistor subsequent to the step of applying the erase voltage to the selected MOS transistor to verify that the selected page of memory was erased; and (d) applying an erase verify unselect voltage to the unselected MOS transistor subsequent to the step of applying the initial erase-inhibit floating voltage to the unselected MOS transistor to avoid erase verifying the unselected page of memory which was erase-inhibited.

14. The method of claim 13, wherein the erase voltage applied to the selected MOS transistor is on the order of about 0 V.

15. The method of claim 13, wherein the initial erase-inhibit floating voltage applied to the selected MOS transistor is 1.7 V to about 2.3 V.

16. The method of claim 13, wherein the MOS transistors comprise n-channel MOS (NMOS) transistors, wherein the step of applying the erase voltage comprises the step of applying the erase voltage to the drain of the selected NMOS transistor, wherein the step of applying the initial erase-inhibit floating voltage comprises the step of applying the initial erase-inhibit floating voltage to the drain of the unselected NMOS transistor, wherein the step of applying the erase verify voltage comprises the step of applying the erase verify voltage to the drain of the selected NMOS transistor, and wherein the step of applying the erase verify unselect voltage comprises the step of applying the erase verify unselect voltage to the drain of the unselected NMOS transistor.

17. The method of claim 13, further comprising the step of applying a first gate turn-on voltage in the range of about 2.7 V to about 3.3 V to the gates of the NMOS transistors during steps (a) and (b).

18. The method of claim 17, further comprising the step of applying a second turn-on voltage in the range of about 7 V to about 8 V to the gates of the NMOS transistors during steps (c) and (d).

19. The method of claim 13, wherein the memory cells are disposed on a semiconductor substrate, further comprising the step of applying a first substrate voltage on the order of about 20 V to the substrate prior to the steps of applying the erase verify voltage to the selected MOS transistor and the erase verify unselect voltage to the unselected MOS transistor.

20. The method of claim 19, wherein the substrate comprises a p-well, and wherein the step of applying the first substrate voltage to the substrate comprises the step of applying the first substrate voltage to the p-well.

21. The method of claim 19, wherein the unselected word line is coupled up to the substrate voltage in response to the step of applying the substrate voltage of about 20 V to the substrate.

22. The method of claim 19, further comprising the step of applying a second substrate voltage of about 0 V to the substrate during the steps of applying the erase verify voltage to the selected MOS transistor and the erase verify unselect voltage to the unselected MOS transistor.

23. The method of claim 22, wherein the substrate comprises a p-well, and wherein the step of applying the second substrate voltage to the substrate comprises the step of applying the second substrate voltage to the p-well.

24. The method of claim 13, wherein the erase verify voltage applied to the selected MOS transistor is on the order of about 0 V.

25. The method of claim 13, wherein the erase verify unselect voltage applied to the unselected MOS transistor is on the order of about 4.5 V.

26. The method of claim 13, wherein the memory cells are connected to a plurality of select source devices comprising a plurality of gates, further comprising the step of applying a source voltage on the order of about 4.5 V to the gates of the select source devices during the steps of applying the erase verify voltage to the selected MOS transistor and the erase verify unselect voltage to the unselected MOS transistor.

27. The method of claim 13, wherein the memory cells are further connected to a plurality of select drain devices comprising a plurality of gates, further comprising the step of applying a drain voltage on the order of about 4.5 V to the gates of the select drain devices during the steps of applying the erase verify voltage to the selected MOS transistor and the erase verify unselect voltage to the unselected MOS transistor.

28. The method of claim 26, wherein the select source devices are connected to an array ground, further comprising the step of applying an array ground voltage on the order of about 0.7 V to the array ground during steps (c) and (d).

29. A method of erasing and erase-verifying a page of memory in a non-volatile memory device comprising a plurality of memory cells arranged in a plurality of sectors, each of the sectors comprising a plurality of word lines each connected to a respective one of a plurality of rows of the memory cells, each of the word lines coupled to a respective one of a plurality of metal oxide semiconductor (MOS) transistors each comprising a gate, a source and a drain, the method comprising the steps of:

(a) applying an erase voltage on the order of about 0 V to a selected one of the MOS transistors to erase a selected page of memory on a selected one of the word lines to which the selected MOS transistor is connected;

(b) applying an initial erase-inhibit floating voltage in the range of about 2.7 V to about 3.3 V to an unselected one of the MOS transistors to maintain an unselected page of memory on an unselected one of the word lines to which the unselected MOS transistor is connected;

(c) applying an erase verify voltage on the order of about 0 V to the selected MOS transistor subsequent to the step of applying the erase voltage to the selected MOS transistor to verify that the selected page of memory was erased; and (d) applying an erase verify unselect voltage on the order of about 4.5 V to the unselected MOS transistor subsequent to the step of applying the initial erase-inhibit floating voltage to the unselected MOS transistor to avoid erase verifying the unselected page of memory which was erase-inhibited.

30. The method of claim 29, wherein the MOS transistors comprise n-channel MOS (NMOS) transistors, wherein the step of applying the erase voltage comprises the step of applying the erase voltage to the drain of the selected NMOS transistor, wherein the step of applying the initial erase-inhibit floating voltage comprises the step of applying the initial erase-inhibit floating voltage to the drain of the unselected NMOS transistor, wherein the step of applying the erase verify voltage comprises the step of applying the erase verify voltage to the drain of the selected NMOS transistor, and wherein the step of applying the erase verify unselect voltage comprises the step of applying the erase verify unselect voltage to the drain of the unselected NMOS transistor.

31. The method of claim 29, further comprising the step of applying a first gate turn-on voltage in the range of about 2.7 V to about 3.3 V to the gates of the NMOS transistors during steps (a) and (b).

32. The method of claim 31, further comprising the step of applying a second turn-on voltage in the range of about 7 V to about 8 V to the gates of the NMOS transistors during steps (c) and (d).

33. The method of claim 29, wherein the memory cells are disposed on a semiconductor substrate, further comprising the step of applying a first substrate voltage on the order of about 20 V to the substrate prior to the steps of applying the erase verify voltage to the selected MOS transistor and the erase verify unselect voltage to the unselected MOS transistor.

34. The method of claim 33, wherein the substrate comprises a p-well, and wherein the step of applying the first substrate voltage to the substrate comprises the step of applying the first substrate voltage to the p-well.

35. The method of claim 33, wherein the unselected word line is coupled up to the substrate voltage in response to the step of applying the substrate voltage of about 20 V to the substrate.

36. The method of claim 33, further comprising the step of applying a second substrate voltage of about 0 V to the substrate during the steps of applying the erase verify voltage to the selected MOS transistor and the erase verify unselect voltage to the unselected MOS transistor.

37. The method of claim 36, wherein the substrate comprises a p-well, and wherein the step of applying the second substrate voltage to the substrate comprises the step of applying the second substrate voltage to the p-well.

38. The method of claim 29, wherein the memory cells are connected to a plurality of select source devices comprising a plurality of gates, further comprising the step of applying a source voltage on the order of about 4.5 V to the gates of the select source devices during the steps of applying the erase verify voltage to the selected MOS transistor and the erase verify unselect voltage to the unselected MOS transistor.

39. The method of claim 29, wherein the memory cells are further connected to a plurality of select drain devices comprising a plurality of gates, further comprising the step of applying a drain voltage on the order of about 4.5 V to the gates of the select drain devices during the steps of applying the erase verify voltage to the selected MOS transistor and the erase verify unselect voltage to the unselected MOS transistor.

40. The method of claim 38, wherein the selected source devices are connected to an array ground, further comprising the step of applying an array ground voltage on the order of about 0.7 V to the array ground during steps (c) and (d).

41. A method of erasing and erase-verifying a page of memory in a non-volatile memory device comprising a plurality of memory cells arranged in a plurality of sectors on a semiconductor substrate, each of the sectors comprising a plurality of word lines each connected to a respective one of a plurality of rows of the memory cells, each of the word lines coupled to a respective one of a plurality of metal oxide semiconductor (MOS) transistors each comprising a gate, a source and a drain, the method comprising the steps of:

(a) applying an erase voltage to a first one of the MOS transistors to erase a first page of memory on a respective first one of the word lines to which the first MOS transistor is connected;

(b) applying an initial erase-inhibit floating voltage to a second one of the MOS transistors to maintain a second page of memory on a respective second one of the word lines to which the second MOS transistor is connected;

(c) applying a first substrate voltage on the order of about 20 V to the substrate during the steps of applying the erase voltage to the first MOS transistor and the initial erase-inhibit floating voltage to the second MOS transistor;

(d) applying an erase verify voltage to the first MOS transistor subsequent to the step of applying the erase voltage to the first MOS transistor to verify that the first page of memory has been erased;

(e) applying an erase verify unselect voltage to the second MOS transistor subsequent to the step of applying the initial erase-inhibit floating voltage to the second MOS transistor to unselect for erase verify the second page of memory which has been erase-inhibited; and (f) applying a second substrate voltage of about 0 V to the substrate during the steps of applying the erase verify voltage to the first MOS transistor and the erase verify unselect voltage to the second MOS transistor.

42. The method of claim 41, wherein the erase voltage applied to the first MOS transistor is on the order of about 0 V.

43. The method of claim 41, wherein the initial erase-inhibit floating voltage applied to the second MOS transistor is in the range of about 1.7 V to about 2.3 V.

44. The method of claim 41, wherein the MOS transistors comprise n-channel MOS (NMOS) transistors, wherein the step of applying the erase voltage comprises the step of applying the erase voltage to the drain of the first NMOS transistor, wherein the step of applying the initial erase-inhibit floating voltage comprises the step of applying the initial erase-inhibit floating voltage to the drain of the second NMOS transistor, wherein the step of applying the erase verify voltage comprises the step of applying the erase verify voltage to the drain of the first NMOS transistor, and wherein the step of applying the erase verify unselect voltage comprises the step of applying the erase verify unselect voltage to the drain of the second NMOS transistor.

45. The method of claim 41, further comprising the step of applying a first gate turn-on voltage in the range of about 2.7 V to 3.3 V to the gates of the MOS transistors during steps (a) and (b).

46. The method of claim 45, further comprising the step of applying a second turn-on voltage in the range of about 7 V to about 8 V to the gates of the NMOS transistors during steps (d) and (e).

47. The method of claim 41, wherein the substrate comprises a p-well, wherein the step of applying the first substrate voltage to the substrate comprises the step of applying the first substrate voltage to the p-well, and wherein the step of applying the second substrate voltage to the substrate comprises the step of applying the second substrate voltage to the p-well.

48. The method of claim 41, wherein the erase verify voltage applied to the first MOS transistor is on the order of about 0 V.

49. The method of claim 41, wherein the erase verify unselect voltage applied to the second MOS transistor is on the order of about 4.5 V.

50. The method of claim 41, wherein the memory cells are connected to a plurality of select source devices and select drain devices comprising a plurality of gates, further comprising the step of applying a voltage on the order of about 4.5 V to the gates of the select source devices and select drain devices during the steps of applying the erase verify voltage to the first MOS transistor and the erase verify unselect voltage to the second MOS transistor.

51. The method of claim 41, wherein the memory cells are connected to a plurality of select source devices comprising a plurality of gates, further comprising the step of applying a source voltage on the order of about 4.5 V to the gates of the select source devices during the steps of applying the erase verify voltage to the selected MOS transistor and the erase verify unselect voltage to the unselected MOS transistor during steps (d) and (e).

52. A method of erasing and erase-verifying a page of memory in a non-volatile memory device comprising a plurality of memory cells arranged in a plurality of sectors on a semiconductor substrate, each of the sectors comprising a plurality of word lines each connected to a respective one of a plurality of rows of the memory cells, each of the word lines coupled to a respective one of a plurality of metal oxide semiconductor (MOS) transistors each comprising a gate, a source and a drain, the memory cells connected to a plurality of select source gates, a plurality of select drain gates and an array ground, the method comprising the steps of:

(a) applying an erase voltage on the order of about 0 V to a first one of the MOS transistors to erase a first page of memory on a respective first one of the word lines to which the first MOS transistor is connected;

(b) applying an initial erase-inhibit floating voltage in the range of about 1.7 V to about 2.3 V to a second one of the MOS transistors to maintain a second page of memory on a respective second one of the word lines to which the second MOS transistor is connected;

(c) applying a first substrate voltage on the order of about 20 V to the substrate during the steps of applying the erase voltage to the first MOS transistor and the initial erase-inhibit floating voltage to the second MOS transistor;

(d) applying an erase verify voltage on the order of about 0 V to the first MOS transistor subsequent to the step of applying the erase voltage to the first MOS transistor to verify that the first page of memory has been erased;

(e) applying an erase verify unselect voltage on the order of about 4.5 V to the second MOS transistor subsequent to the step of applying the initial erase-inhibit floating voltage to the second MOS transistor to unselect for erase verify the second page of memory which has been erase-inhibited;

(f) applying a second substrate voltage of about 0 V to the substrate during the steps of applying the erase verify voltage to the first MOS transistor and the erase verify unselect voltage to the second MOS transistor;

(g) applying an array ground voltage on the order of about 0.7 V to the array ground during the steps of applying the erase verify voltage to the first MOS transistor and the erase verify unselect voltage to the second MOS transistor; and (h) applying a voltage on the order of about 4.5 V to the select drain gates and select source gates during the steps of applying the erase verify voltage to the first MOS transistor and the erase verify unselect voltage to the second MOS transistor.

53. The method of claim 52, wherein the MOS transistors comprise n-channel MOS (NMOS) transistors, wherein the step of applying the erase voltage comprises the step of applying the erase voltage to the drain of the first NMOS transistor, wherein the step of applying the initial erase-inhibit floating voltage comprises the step of applying the initial erase-inhibit floating voltage to the drain of the second NMOS transistor, wherein the step of applying the erase verify voltage comprises the step of applying the erase verify voltage to the drain of the first NMOS transistor, and wherein the step of applying the erase verify unselect voltage comprises the step of applying the erase verify unselect voltage to the drain of the second NMOS transistor.

54. The method of claim 52, further comprising the step of applying a first gate turn-on voltage in the range of about 2.7 V to about 3.3 V to the gates of the MOS transistors during steps (a) and (b).

55. The method of claim 54, wherein the memory cells are connected to a plurality of select source devices comprising a plurality of gates, further comprising the step of applying a source voltage on the order of about 4.5 V to the gates of the select source devices during the steps of applying the erase verify voltage to the selected MOS transistor and the erase verify unselect voltage to the unselected MOS transistor during steps (d) and (e).

56. The method of claim 52, wherein the substrate comprises a p-well, wherein the step of applying the first substrate voltage to the substrate comprises the step of applying the first substrate voltage to the p-well, and wherein the step of applying the second substrate voltage to the substrate comprises the step of applying the second substrate voltage to the p-well.

* * * * *

UNITED STATES PATENT AND TRADEMARK OFFICE
CERTIFICATE OF CORRECTION

PATENT NO. : 5,995,417
DATED : November 30, 1998
INVENTOR(S) : Chen et al.

It is certified that error appears in the above-identified patent and that said Letters Patent is hereby corrected as shown below:

<u>Title page,</u>
Item [73], Assignee, please delete "Advanced Micro Devices, Inc." and insert
-- Advanced Micro Devices, Inc., Sunnyvale, CA and Fujitsu Limited, Kanagawa, Japan --.

Signed and Sealed this

Nineteenth Day of November, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.   : 5,995,417  
DATED        : November 30, 1999  
INVENTOR(S)  : Chen et al.

Page 1 of 1

It is certified that error appears in the above-identified patent and that said Letters Patent is hereby corrected as shown below:

<u>Title page,</u>
Item [73], Assignee, please delete "Advanced Micro Devices, Inc." and insert
-- Advanced Micro Devices, Inc., Sunnyvale, CA and Fujitsu Limited, Kanagawa, Japan --.

This Certificate of Correction supercedes Certificate issued November 19, 2002.

Signed and Sealed this

Seventh Day of January, 2003

JAMES E. ROGAN
*Director of the United States Patent and Trademark Office*